United States Patent [19]

Itoh et al.

[11] Patent Number: 4,733,103

[45] Date of Patent: Mar. 22, 1988

[54] LIGHT SENSITIVE SWITCHING CIRCUIT

[75] Inventors: Hiromu Itoh, Nara; Junichiro Kikunaga, Tondabayashi; Tatsuya Kato; Kenji Hachimura, both of Nara, all of Japan

[73] Assignee: Sharp Kabushiki Kaisha, Osaka, Japan

[21] Appl. No.: 769,876

[22] Filed: Aug. 27, 1985

[30] Foreign Application Priority Data

| Aug. 27, 1984 | [JP] | Japan | 59-177878 |
| Aug. 31, 1984 | [JP] | Japan | 59-182987 |
| Sep. 10, 1984 | [JP] | Japan | 59-189960 |
| Sep. 11, 1984 | [JP] | Japan | 59-190325 |
| Oct. 24, 1984 | [JP] | Japan | 59-224854 |

[51] Int. Cl.$^4$ ............ H01H 35/00; H03K 3/42; H01J 40/14
[52] U.S. Cl. ............ 307/117; 307/311; 307/632; 250/214 R; 250/214 AL; 250/206; 315/158; 315/159
[58] Field of Search ............ 307/117, 311, 252 C, 307/252 N, 252 J, 252 R, 252 B; 315/159, 158, 149, 155; 250/214 R, 214 AL, 205, 206; 323/221, 902

[56] References Cited

U.S. PATENT DOCUMENTS

| 3,088,051 | 4/1963 | Scanlon | 250/206 X |
| 3,294,974 | 12/1966 | Riebs | 250/206 |
| 3,584,222 | 6/1971 | Nesbitt | 250/206 |
| 3,676,685 | 7/1972 | Myer | 250/214 SW |
| 3,821,565 | 6/1974 | Horinaga | 307/252 C |
| 3,900,763 | 8/1975 | Turner | 315/159 X |
| 3,962,600 | 6/1976 | Pittman | 315/159 X |
| 4,330,706 | 5/1982 | Lawenhaupt | 250/214 AL |

FOREIGN PATENT DOCUMENTS

| 0009363 | 1/1977 | Japan | 307/252 C |
| 0020333 | 2/1981 | Japan | 307/252 C |

*Primary Examiner*—William M. Shoop, Jr.
*Assistant Examiner*—Sharon D. Logan
*Attorney, Agent, or Firm*—Birch, Stewart, Kolasch & Birch

[57] ABSTRACT

A light sensitive switching circuit for automatically controlling the supply of electric power from a power source to a load, such as a lantern, is disclosed. When it becomes darker than a predetermined brightness the power supply starts and when it becomes bright again, the power supply is cut. The light sensitive switching circuit comprises first and second lines for connecting the power source and the load in series between the first and second lines. A first thyristor is connected between the first and second lines, and a second thyristor connected is to the first thyristor such that the anode of the second thyristor is connected to the gate of the first thyristor and the cathode of the second thyristor is connected to the cathode of the first thyristor. A photocell is connected between the gate and the cathode of the second thyristor.

16 Claims, 13 Drawing Figures

LIGHT SENSITIVE SWITCHING CIRCUIT

BACKGROUND OF THE INVENTION

1. Field of the Invention

The present invention relates to a light sensitive switching circuit and, more particularly, to a switching circuit which turns off upon detection of light.

2. Description of the Prior Art

The switching circuit of the above described type is used, for example, in combination with an outdoor lantern which turns on automatically when it becomes dark and turns off automatically when it becomes light.

The switching circuit generally includes a photosensor, such as phototransistor or CdS, for detecting the change in the brightness and a switching element for making and breaking the power supply to the load, such as a lantern. According to the prior art, the control of the switching element is done by a controller including a constant voltage source and various elements, such as transistors and resistors.

FIG. 1 shows a circuit diagram of a prior art light sensitive switching circuit which has hysteresis characteristics such that the lantern turns on when it becomes as dark as L1 and turns off when it becomes as light as L2, provided that L1 is darker than L2, as diagrammatically shown in FIG. 5. The operation of the prior art light sensitive switching circuit is described below.

When it is very dark, such as in the night time, the CdS shows a high resistance. Therefore, the voltage level at the junction A is low, resulting in a low voltage level at the junction B. Thus, transistor Tr121 turns on to permit a current flow through resistor R125. Thus, a voltage level at the junction C and also that at the junction D are high, thereby maintaining transistor Tr122 off. At this time, since the voltage level at the junction E is about 0 volts, transistor Tr123 is in the off condition. Accordingly, a current flows through resistor R130 to the gate of thyristor Th121, thereby turning thyristor Th121 on. Thus, through diode bridge DB121, a current flows to the base of triac T121, thereby turning triac T121 on. Accordingly, lantern L turns on.

When it is bright, such as in the day time, the CdS shows a low resistance. Therefore, the voltage level at the junction A and that at the junction B are high. Accordingly, transistor Tr21 is turned off. At this time, the junctions C and D have voltage levels divided by resistors R126, R127 and R125. Thus, by the voltage at the junction D, transistor Tr122 turns on. When transistor Tr122 is on, current flows through resistor R129, thereby increasing the voltage level at the junction E, and, in turn, turning transistor Tr123 on. Since transistor Tr123 receives to its collector a current from resistor R130 and also from the gate of thyristor Th121, thyristor Th121 turns off. When thyristor Th121 turns off, triac T121 also turns off, thereby cutting the power supply to lantern L.

According to the prior art switching circuit of FIG. 1, a constant voltage source defined by zener diode ZD, diode D, capacitor C122 and resistor R121 is necessary. Thus, because the constant voltage source is necessary, the circuit of FIG. 1 cannot employ such a circuit connection whereby lantern L and power source E are connected in series between power supply lines. Also, the control circuit for controlling triac T121 requires a number of circuit elements, such as transistors Tr121, Tr122 and Tr123, thyristor T121, etc. Thus, the circuit of the prior art requires many construction parts, and thus, results in a high manufacturing cost.

SUMMARY OF THE INVENTION

The present invention has been developed with a view to substantially solving the above described disadvantages and has for its essential object to provide an improved light sensitive switching circuit.

It is also an essential object of the present invention to provide a light sensitive switching circuit of the above described type which is simple in structure and can be readily manufactured at low cost.

It is a further object of the present invention to provide a light sensitive switching circuit of the above described type which can be so arranged as to have hysteresis characteristics.

In accomplishing these and other objects, a light sensitive switching circuit according to the present invention comprises first and second lines for connecting the power source and the load in series between the first and second lines. A first thyristor is connected between the first and second lines, and a second thyristor is connected to the first thyristor such that the anode of the second thyristor is connected to the gate of the first thyristor and the cathode of the second thyristor is connected to the cathode of the first thyristor. A photocell is connected between the gate and the cathode of the second thyristor.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

First Embodiment

Figure 1:
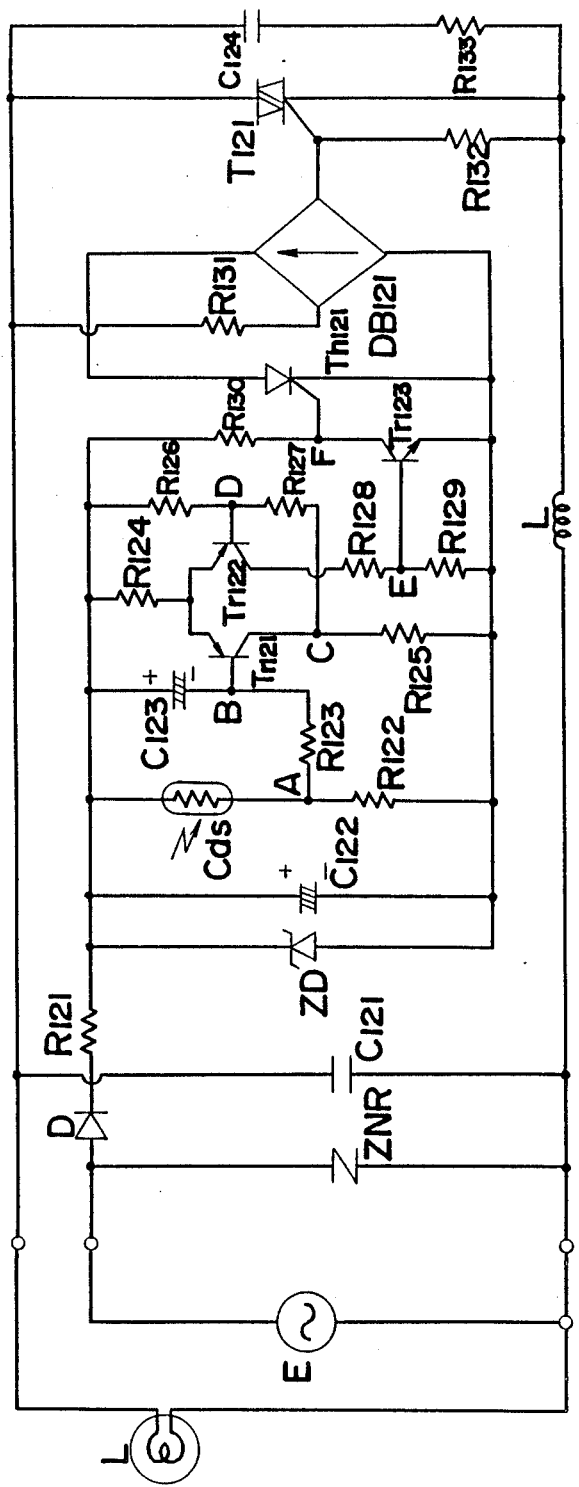
FIG. 1 is a circuit diagram of a light sensitive switching circuit according to the prior art.
Figure 2:
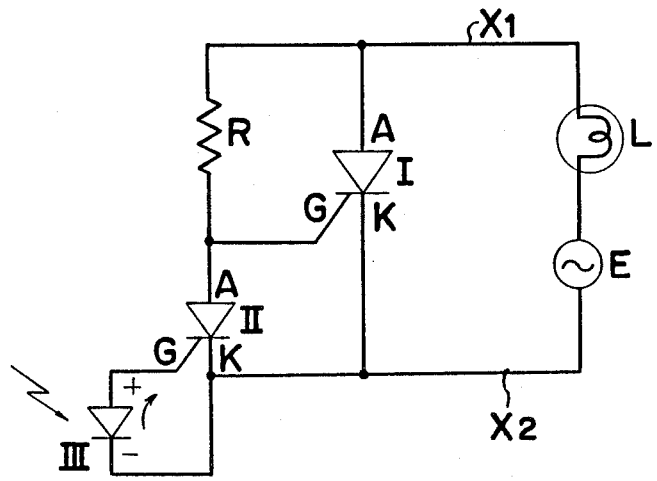
FIG. 2 is a circuit diagram of a light sensitive switching circuit according to a first embodiment of the present invention, which is operative with an AC power source.

Referring to FIG. 2, a light sensitive switching circuit according to a first embodiment of the present invention is shown. An AC power source, such as a commercial power source E, and a load, such as a lantern L, are connected in series between lines X1 and X2. Also a first thyristor I is connected between lines X1 and X2 such that its anode is connected to line X1 and its cathode is connected to line X2. A second thyristor II is connected between line X2 and the gate of first thyristor I. A photocell III, such as a solar battery, is connected between the gate and the cathode of second thyristor II such that its anode is connected to the gate of thyristor II and its cathode is connected to the cathode of thyristor II. A suitable resistor R is connected between the gate and the anode of first thyristor I.

The light sensitive switching circuit of FIG. 2 operates in the following manner.

When it is bright, the light impinges on photocell III which is therefor a photovoltaic cell. Thus, a voltage is generated across photocell III to effect a current flow in the direction indicated by an arrow through the gate and cathode of second thyristor II. Accordingly, second thyristor II is turned on to shortcircuit the gate and cathode of first thyristor I. Thus, first thyristor I is turned off to cut the power supply to lantern L. Although a small amount of current flows through resistor R and second thyristor II, it is not sufficient at all to turn the lantern on.

When it is dark, no or less light impinges on photocell III. Thus, no or little current flows through the gate and the cathode of second thyristor II. Accordingly, the connection between the gate and the cathode of first thyristor I opens to provide a voltage to the gate of first thyristor I through resistor R. Thus, first thyristor I turns on to permit current flow from power source E through lantern L and thyristor I to turn the lantern on.

According to the present invention, thyristor I, which directly controls the on and off state of the lantern, turns off when it is bright and turns on when it is dark. Also, on and off state of first thyristor I is controlled by second thyristor II and photocell III.

Figure 3:
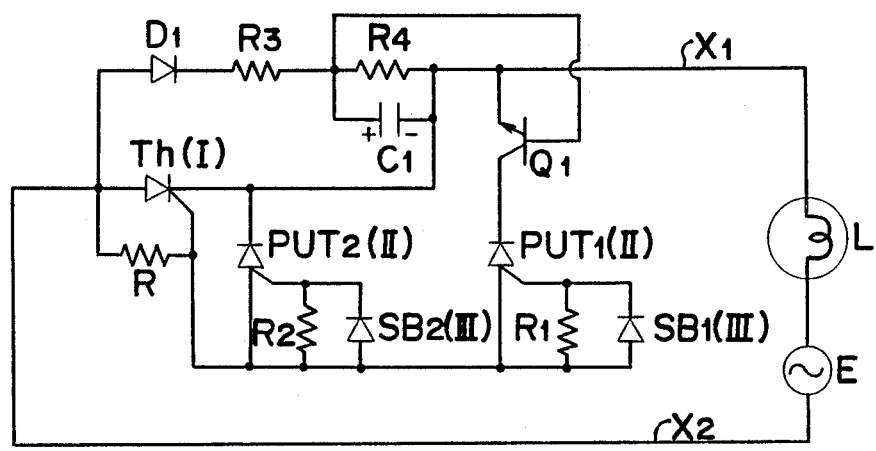
FIG. 3 is a circuit diagram of a light sensitive switching circuit of the first embodiment half-cycle type, operative during the half cycle of the AC power and designed to operate under hysteresis characteristics.

Referring to FIG. 3, a light sensitive switching circuit of the first embodiment half-cycle type, which is operative during the half cycle of the AC power and designed to operate under the hysteresis characteristics, is shown. A series connection of AC power source E and lantern L is connected between lines X1 and X2. Also a thyristor Th is connected between lines X1 and X2. A suitable resistor R is connected between the gate and the anode of thyristor Th. The gate of thyristor Th is also connected to each of programmable unijunction transistors PUT1 and PUT2 at their anode.

Between the gate and the anode of programmable unijunction transistor PUT2, resistor R2 and photocell SB2, e.g., a solar battery, are connected parallel such that the cathode of photocell SB2 is connected to the gate of transistor PUT2. The cathode of transistor PUT2 is connected to the cathode of thyristor Th.

Similarly, between the gate and the anode of programmable unijunction transistor PUT1, resistor R1 and photocell SB1, e.g., a solar battery, are connected parallel. The cathode of transistor PUT1 is connected to a collector of transistor Q1. The emitter of transistor Q1 is connected to the cathode of thyristor Th.

AC power source E is also connected through diode D1, resistors R3 and R4 to the emitter of transistor Q1. A capacitor C1 is connected parallel to resistor R4. A junction between resistors R3 and R4 is connected to the base of transistor Q1.

It is to be noted that, when the circuit of FIG. 3 is compared with the circuit of FIG. 2, thyristor Th corresponds to first thyristor I, programmable unijunction transistors PUT1 and PUT2 correspond to second thyristor II, and photocells SB1 and SB2 correspond to photocell III.

The light sensitive switching circuit of the first embodiment half-cycle type as shown in FIG. 3 operates in the following manner.

Each of programmable unijunction transistors PUT1 and PUT2 operates such that when the anode voltage exceeds the gate voltage by a predetermined amount, the programmable unijunction transistor turns on to provide a conductive state between the anode and the cathode thereof. Then, when the anode voltage falls below the cathode voltage, the programmable unijunction transistor turns off to provide a nonconductive state.

Figure 4:
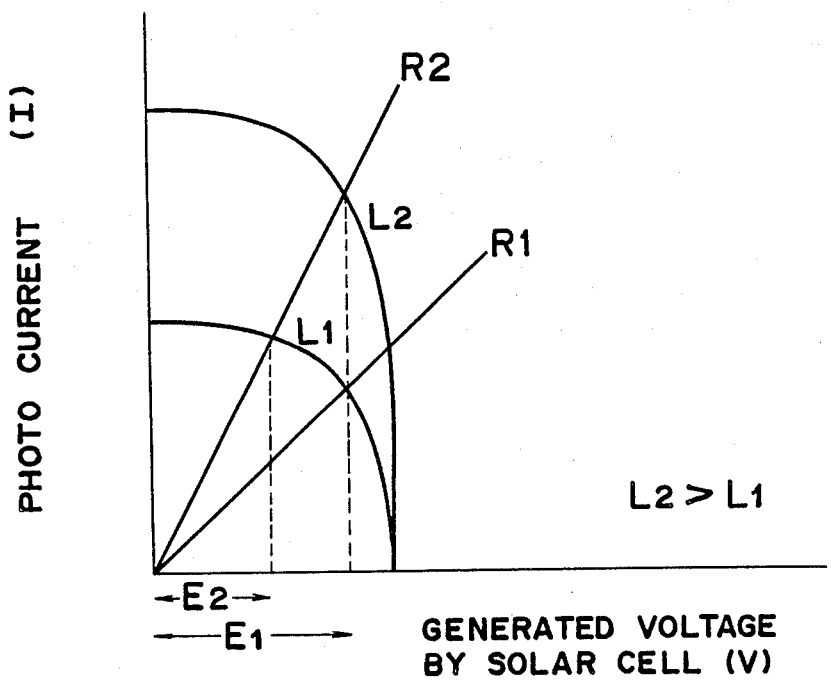
FIG. 4 is a graph showing V-I characteristics of the photocells employed in the circuit of FIG. 3.
Figure 5:
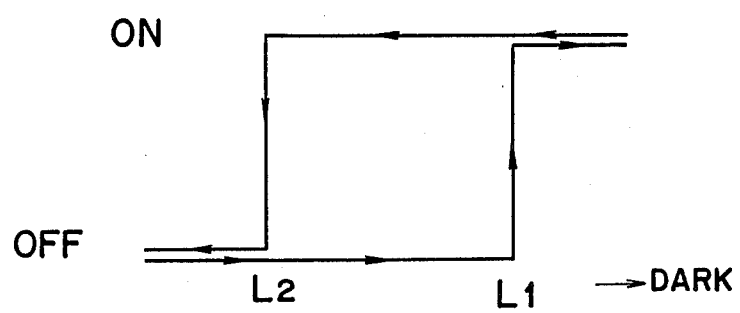
FIG. 5 is a diagram showing the hysteresis characteristics of the circuit of FIG. 3.

Each of photocells SB1 and SB2 is provided to receive an ambient light for detecting the brightness around the photocells. The output characteristics of the photocells used are shown in the graph of FIG. 4 in which abscissa and ordinate represent a voltage generated across the cell and a photocurrent, respectively. Resistor R1 is so selected as to generate a voltage E1 volts when photocell SB1 receives light under the illuminance of L1 lux. Also, resistor R2 is so selected as to generate a voltage E1 volts when photocell SB2 receives light under the illuminance of L2 lux, which is brighter than L1. The voltage E1 is the voltage that turns on each of programmable unijunction transistors PUT1 and PUT2. More specifically, when the photocell generates the voltage E1, the anode voltage of the programmable unijunction transistor exceeds the gate voltage thereof, and by the gate current, the anode of the programmable unijunction transistor conducts with the cathode thereof. When the illuminance is L1 lux, photocell SB2 is activated to generate voltage E2 volts across resistor R2. However, since voltage E2 is smaller than voltage E1, the programmable unijunction transistor will not turn on by the voltage E2. Thus, when it becomes gradually bright, programmable unijunction transistor PUT1 turns on first under the illuminance of L1 lux and then when it becomes as bright as the illuminance of L2 lux, programmable unijunction transistor PUT2 also turns on. The change of on and off of thyristor Th, thus lantern L, with respect to the change of brightness is diagrammatically shown in FIG. 5. Since the line shown in FIG. 5 is similar to the hysteresis curve, the operation of the circuit of FIG. 3 can be said to have hysteresis characteristics.

It is assumed that photocells SB1 and SB2 are now located in a dark place, such as in the night time. Under this condition, no voltage is produced across resistor R1 or R2, resulting in no voltage difference between anode and gate in each programmable unijunction transistor. Therefore, programmable unijunction transistors PUT1 and PUT2 are maintained in an off state. Thus, during the positive half cycle of AC power from power source E, a gate current flows from power source E through resistor R to the gate of thyristor Th, thereby turning thyristor Th on. Thus, during the positive half cycle of AC power, an electric power is supplied through thyristor Th to lantern L. During the negative half cycle of AC power, thyristor Th is turned off, thereby cutting the power supply to lantern L.

When no gate current flows to the gate of thyristor Th, during the positive half cycle, by the reason explained later, thyristor Th is maintained nonconductive state. In such a condition, a voltage Ep is produced between the anode and the cathode of thyristor Th. This voltage is rectified by diode D1 and is divided by resistors R3 and R4, thereby producing a predetermined voltage Er across resistor R4 which is stored in a capacitor C1.

It is to be noted that the resistance of resistors R3 and R4 is greater than the internal resistance rL of lantern L (R3+R4>>rL) so that the current supplied from power source E through resistors R3 and R4 to lantern L can be disregarded.

Thus, in response to the turn off of thyristor Th, the voltage Er is generated across capacitor C1, thereby turning transistor Q1 on.

However, as long as photocells SB1 and SB2 are located in the dark, thyristor Th is maintained on, thereby permitting the current flow therethrough from power source E to lantern L, and producing no voltage Er across resistor R4.

Then, when photocells SB1 and SB2 are located in a little bright place under the illuminance of L1 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on and programmable unijunction transistor PUT2 is maintained off. However, since transistor Q1 is now in the off condition, no shortcircuit is established between the gate and cathode of thyristor Th. Thus, thyristor Th is still maintained in the on condition.

Then, when it becomes as bright as the illuminance of L2 lux, both photocells SB1 and SB2 generate a voltage E1 volts or greater. Thus, both programmable unijunction transistors PUT1 and PUT2 turn on. Particularly, by the turn on of programmable unijunction transistor PUT2, the gate and cathode of thyristor Th is shortcircuited thereby turning the thyristor Th off. Thus, power supply is cut to turn lantern L off. When thyristor Th turns off, a small current flows from power source E, line X2, diode D1, resistors R3 and R4, line X1 and lantern L and back to power source E. Accordingly, a predetermined voltage is produced across resistor R4 for charging capacitor C1. Then, by the voltage across capacitor C1, transistor Q1 turns on.

Then, when it becomes as dark as the illuminance between L1 lux and L2 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on and programmable unijunction transistor PUT2 turns off. However, since transistor Q1 is now in the on condition, the shortcircuit between the gate and cathode of thyristor Th is still maintained to hold the thyristor Th in the off condition.

Then, when it becomes darker than the illuminance of L1 lux, both photocells SB1 and SB2 are so activated as to generate a voltage less than E1 volts across each of resistors R1 and R2. Accordingly, both programmable unijunction transistors PUT1 and PUT2 are turned off to break the connection between the gate and cathode of thyristor Th and, at the same time, providing a predetermined voltage to the gate of thyristor Th through resistor R. Thus, thyristor Th is turned on again to supply power to lantern L.

It is to be noted that by the change of resistances of resistors R1 and R2, the operating points of the illuminances L1 and L2 can be changed, respectively.

Figure 6:
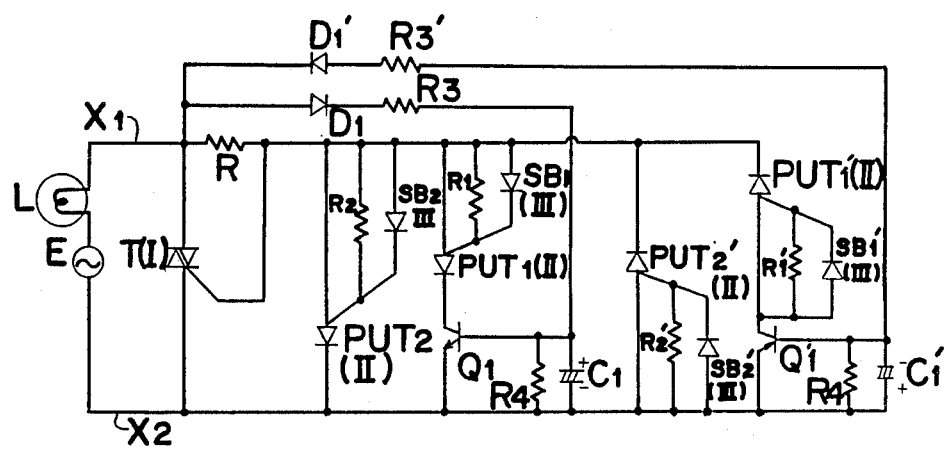
FIG. 6 is a circuit diagram of a light sensitive switching circuit of the first embodiment full-cycle type which is operative during the full cycle of the AC power and designed to operate under the hysteresis characteristics.

Referring to FIG. 6, a circuit diagram of a light sensitive switching circuit of the first embodiment full-cycle type is shown. When the circuit of FIG. 6 is compared with the circuit of FIG. 3, thyristor Th is replaced by a triac T and the circuit elements designated by reference characters provided with a prime are further added. The circuit elements designated by reference characters with prime are arranged in the same manner as those designated by reference characters without prime, i.e., those of FIG. 3, but are connected in the opposite direction.

When triac T is turned on, lantern L is supplied with power during the first half cycle by the circuit elements without prime, and it is supplied with power during the second half cycle by the circuit elements with prime.

Figure 7:
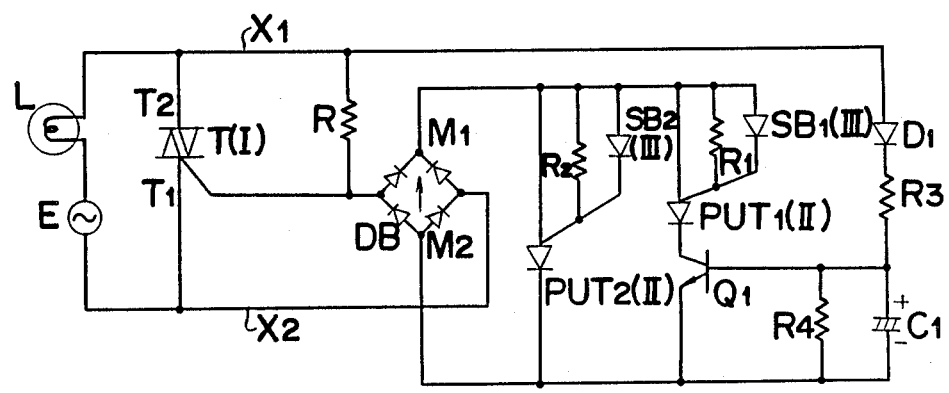
FIG. 7 is a circuit diagram of a light sensitive switching circuit of the first embodiment full-cycle type which is an improvement of the circuit of FIG. 6.

Referring to FIG. 7, a circuit diagram of a light sensitive switching circuit of the first embodiment full-cycle type is shown. The circuit of FIG. 7 is an improvement of the circuit of FIG. 6.

A series connection of AC power source E and lantern L is connected between lines X1 and X2. Also a triac T is connected between lines X1 and X2. A suitable resistor R is connected between the gate of triac T and line X1. A diode bridge DB is connected between the gate and terminal T1 of triac T thereby causing the current flow in the direction indicated by an arrow in both negative and positive half cycles of AC power. Diode bridge DB has terminals M1 and M2 in which terminal M1 is connected to each of programmable unijunction transistors PUT1 and PUT2 at their anode.

Between the gate and the anode of programmable unijunction transistor PUT2, resistor R2 and photocell SB2, e.g., a solar battery, are connected parallel such that the cathode of photocell SB2 is connected to the gate of transistor PUT2. The cathode of transistor PUT2 is connected to terminal M2 of diode bridge DB.

Similarly, between the gate and the anode of programmable unijunction transistor PUT1, resistor R1 and photocell SB1, e.g., a solar battery, are connected parallel. The cathode of transistor PUT1 is connected to a collector of transistor Q1. The emitter of transistor Q1 is connected to terminal M2 of diode bridge DB.

A series connection of diode D1 and resistors R3 and R4 is connected between line X1 and terminal M2. Also, a capacitor C1 is connected parallel to resistor R4. A junction between resistors R3 and R4 is connected to the base of transistor Q1.

It is to be noted that, when the circuit of FIG. 7 is compared with the circuit of FIG. 2, triac T corresponds to first thyristor I, programmable unijunction transistors PUT1 and PUT2 correspond to second thyristor II, and photocells SB1 and SB2 correspond to photocell III.

The light sensitive switching circuit of the first embodiment full-cycle type shown in FIG. 7 operates in the following manner.

It is assumed that photocells SB1 and SB2 are now located in a dark place, such as in the night time. Under this condition, no voltage is produced across resistor R1 or R2, resulting in no voltage difference between anode and gate in each programmable unijunction transistor. Therefore, programmable unijunction transistors PUT1 and PUT2 are maintained off. Thus, no current flows through diode bridge DB, resulting in an open circuit between gate and terminal T1 of triac T. Thus, triac T turns on to permit current flow in both directions therethrough. Thus, an electric power is supplied through triac T to lantern L during both positive and negative half cycles of AC power.

Then, when photocells SB1 and SB2 are located in a little bright place having the illuminance of L1 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on and programmable unijunction transistor PUT2 is maintained off. However, since transistor Q1 is now in the off condition, no shortcircuit is established between the gate and terminal T1 of triac T. Thus, triac T is still maintained in the on condition, thereby lighting the lantern.

Then, when it becomes as bright as the illuminance of L2 lux, both photocells SB1 and SB2 generate a voltage E1 volts or greater. Thus, both programmable unijunction transistors PUT1 and PUT2 turn on. Particularly, by the turn on of programmable unijunction transistor PUT2, the gate and terminal T1 of triac T are shortcircuited thereby turning triac T off. Thus, power is cut turning lantern L off. When triac T turns off, a small current flows from power source E, lantern L, line X1, diode D1, resistors R3 and R4, diode bridge DB and line X2 and back to power source E. Accordingly, a predetermined voltage is produced across resistor R4 for charging capacitor C1. Then, by the voltage across capacitor C1, transistor Q1 turns on.

Then, when it becomes as dark as the illuminance between L1 lux and L2 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on and programmable unijunction transistor PUT2 turns off. However, since transistor Q1 is on at this stage, the shortcircuit between the gate and terminal T1 of triac T is still continues thereby holding triac T in the off condition.

Then, when it becomes darker than the illuminance of L1 lux, both photocells SB1 and SB2 are so activated as to generate a voltage less than E1 volts across each of resistors R1 and R2. Accordingly, both programmable unijunction transistors PUT1 and PUT2 are turned off to break the connection between the gate and terminal T1 of triac T and providing a predetermined voltage to the gate of triac T through resistor R. Thus, triac T is turned on again to supply power to lantern L.

Figure 8:
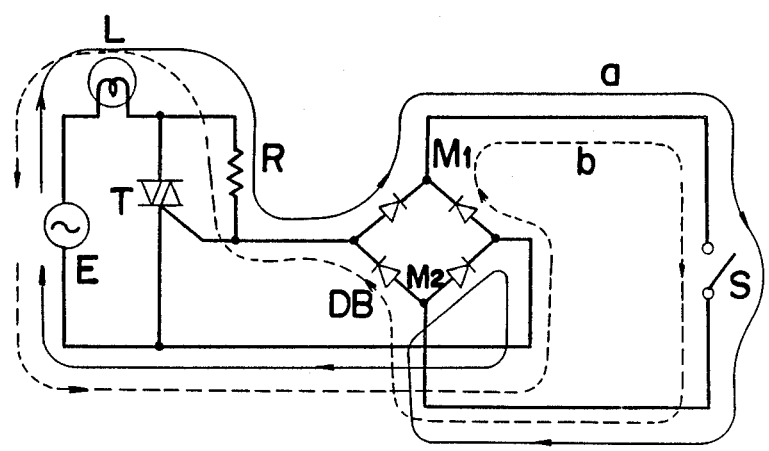
FIG. 8 is a simplified circuit diagram of the circuit of FIG. 7 showing the current flow during the first and second half cycles of the AC power.

Referring to FIG. 8, a simplified circuit diagram of the circuit of FIG. 7 is shown, in which a switch S shown in FIG. 8 represents circuit elements on the right hand side of diode bridge DB in FIG. 8. As indicated by real line a and dotted line b, a current flows through switch S in the same directions during the positive and negative half cycles of the AC power from power source E. Therefore, the circuit of FIG. 7 does not require two switches for the positive and negative half cycles as required in the circuit of FIG. 6. Thus, the number of circuit elements is reduced and, the circuit itself is simplified.

Second Embodiment

Figure 9:
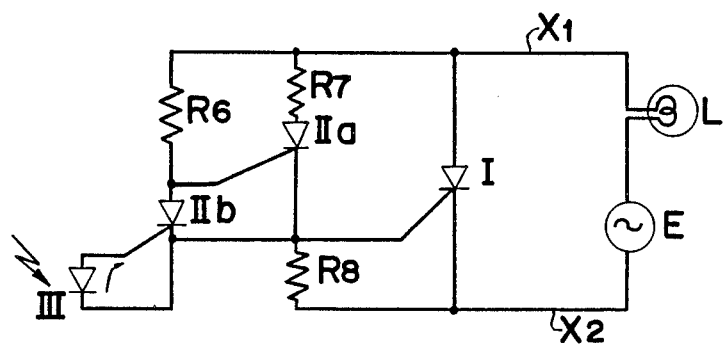
FIG. 9 is a circuit diagram of a light sensitive switching circuit according to a second embodiment of the present invention which is operative with an AC power source.

Referring to FIG. 9, a light sensitive switching circuit according to a second embodiment of the present invention is shown. Like the first embodiment, an AC power source, such as a commercial power source E, and a load, such as a lantern L, are connected in series between lines X1 and X2. Also a first thyristor I is connected between lines X1 and X2 such that its anode is connected to line X1 and its cathode is connected to line X2. A second thyristor IIa is connected between line X1 and the gate of first thyristor I, and a third thyristor IIb is connected between the gate and the cathode of second thyristor IIa such that the anode and the cathode of thyristor IIb are connected, respectively, to the gate and the cathode of thyristor IIa. A photocell III, such as a solar battery, is connected between the gate and the cathode of third thyristor IIb such that its anode is connected to the gate of thyristor IIb and its cathode is connected to the cathode of thyristor IIb. A suitable resistor R7 is connected between line X1 and the anode of second thyristor IIa, and another suitable resistor R8 is connected between the gate and the cathode of first thyristor I.

The light sensitive switching circuit of FIG. 9 operates in the following manner.

When it is bright, the light impinges on photocell III. Thus, a voltage is generated across photocell III to effect a current flow in the direction indicated by an arrow through the gate and cathode of third thyristor IIb. Accordingly, third thyristor IIb is turned on to shortcircuit the gate and cathode of second thyristor IIa. Thus, second thyristor IIa is turned off to break the connection between resistor R7 and the gate of first thyristor I. Accordingly, first thyristor I is turned of to cut the power supply to lantern L.

When it is dark, no or less light impinges on photocell III. Thus, no or little current flows through the gate and the cathode of third thyristor IIb. Accordingly, third thyristor IIb turns off to open between the gate and the cathode of second thyristor IIa. Thus, a voltage is provided to the gate of second thyristor IIa through resistor R6. Thus, second thyristor IIa turns on to provide a voltage to the gate of first thyristor I. Thus, first thyristor I turns on to permit current flow from power source E through lantern L and thyristor I to turn the lantern on.

According to the present invention, first thyristor I, which directly controls the on and off of the lantern, turns off when it is bright and turns on when it is dark. Also, the turning on and off of first thyristor I is controlled by second and third thyristors IIa and IIb and photocell III.

Figure 10:
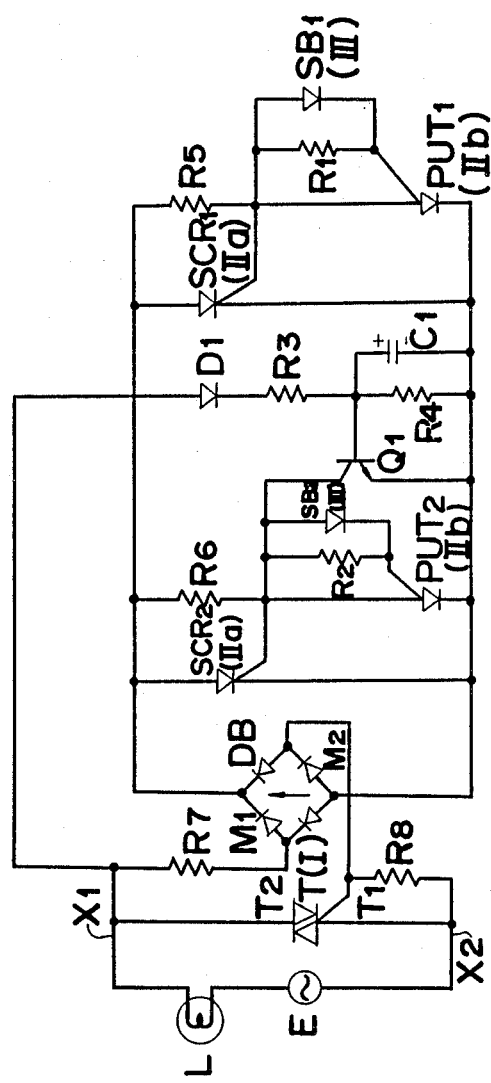
FIG. 10 is a circuit diagram of a light sensitive switching circuit of the second embodiment full-cycle type which is operative during the full cycle of the AC power and designed to operate under the hysteresis characteristics.

Referring to FIG. 10, a circuit diagram of a light sensitive switching circuit of the second embodiment full-cycle type is shown. The circuit of FIG. 10 has a structure similar to that of FIG. 7.

A series connection of AC power source E and lantern L is connected between lines X1 and X2. Also a triac T is connected between lines X1 and X2. A suitable resistor R8 is connected between the gate of triac T and lin X2. A diode bridge DB is connected between the gate and resistor R7, which is further connected to line X1. Diode bridge DB has terminals M1 and M2 between which thyristors SCR1 and SCR2 are connected parallelly in the forward direction.

Between the gate and the cathode of thyristor SCR2, a programmable unijunction transistor PUT2 is connected such that the gate of thyristor SCR2 is connected to the anode of unijunction transistor PUT2 and the cathode of thyristor SCR2 is connected to the cathode of unijunction transistor PUT2. Also, a resistor R6 is connected between the gate and the anode of thyristor SCR2.

Between the gate and the anode of programmable unijunction transistor PUT2, resistor R2 and photocell SB2, e.g., a solar battery, are connected parallel such that the cathode of photocell SB2 is connected to the gate of transistor PUT2. The cathode of transistor PUT2 is connected to terminal M2 of diode bridge DB.

Similarly, between the gate and the cathode of thyristor SCR1, a programmable unijunction transistor PUT1 is connected such that the gate of thyristor SCR1 is connected to the anode of unijunction transistor PUT1 and the cathode of thyristor SCR1 is connected to the cathode of unijunction transistor PUT1. Also, a resistor R5 is connected between the gate and the anode of thyristor SCR1.

Also, between the gate and the anode of programmable unijunction transistor PUT1, resistor R1 and photocell SB1, e.g., a solar battery, are connected parallel.

In the first embodiment, such as shown in FIG. 7, transistor Q1 is provided in series with programmable unijunction transistor PUT1. But in the second embodiment shown in FIG. 10, transistor Q1 is provided parallel to programmable unijunction transistor PUT2.

It is to be noted that, when the circuit of FIG. 10 is compared with the circuit of FIG. 9, triac T corresponds to first thyristor I, thyristors SCR1 and SCR2 correspond to second thyristor IIa, programmable unijunction transistors PUT1 and PUT2 correspond to third thyristor IIb, and photocells SB1 and SB2 correspond to photocell III.

The light sensitive switching circuit of the second embodiment full-cycle shown in FIG. 10 operates in the following manner.

It is assumed that photocells SB1 and SB2 are now located in a dark place, such as in the night time. Under this condition, no voltage is produced across resistor R1 or R2, resulting in no voltage difference between anode and gate in each programmable unijunction transistor. Therefore, programmable unijunction transistors PUT1 and PUT2 are maintained off. Thus, thyristors SCR1 and SCR2 are both turned on to make an electric connection between the gate of triac T and resistor R7, thereby turning triac T on. Thus, a current flows through triac T in both directions thereby supplying electric power to lantern L during both positive and negative half cycles of AC power.

Then, when photocells SB1 and SB2 are located in a little bright place having the illuminance of L1 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on and programmable unijunction transistor PUT2 is maintained in an off state. At this stage, since transistor Q1 is now in the off condition and the programmable unijunction transistor PUT2 is still off, thyristor SCR2 continues to be turned on. Thus, triac T is still maintained on, thereby lighting the lantern.

Then, when it becomes as bright as the illuminance of L2 lux, both photocells SB1 and SB2 generate a voltage E1 volts or greater. Thus, both programmable unijunction transistors PUT1 and PUT2 turn on, thereby turning both thyristors SCR1 and SCR2 off. Thus, the electric connection between the gate of triac T and resistor R7 opens thereby turning triac T off. Thus, power is cut to turn lantern L off. When triac T is off, a small current flows from power source E, lantern L, line X1, diode D1, resistors R3 and R4, diode bridge DB, resistor R8 and line X2 and back to power source E. Accordingly, a predetermined voltage is produced across resistor R4 for charging capacitor C1. Then, by the voltage across capacitor C1, transistor Q1 turns on.

Then, when it becomes as dark as the illuminance between L1 lux and L2 lux, photocell SB1 is so activated as to generate a voltage E1 volts across resistor R1 and, at the same time, photocell SB2 is so activated to generate a voltage E2 volts across resistor R2. Thus, programmable unijunction transistor PUT1 turns on to maintain the thyristor SCR1 off. Furthermore, programmable unijunction transistor PUT2 turns off, but since transistor Q1 is on at this stage, the shortcircuit between the gate and the cathode of thyristor SCR2 maintained thyristor SCR2 off. Thus, no electric connection is established between the gate of triac T and resistor R7, thereby maintaining triac T still off.

Then, when it becomes darker than the illuminance of L1 lux, both photocells SB1 and SB2 are so activated as to generate a voltage less than E1 volts across each of resistors R1 and R2. Accordingly, both programmable unijunction transistors PUT1 and PUT2 are turned off. Thus, thyristors SCR1 and SCR2 turn on to establish a connection between the gate of triac T and resistor R7, thereby turning triac T on to effect the power supply to the lantern.

Figure 11:
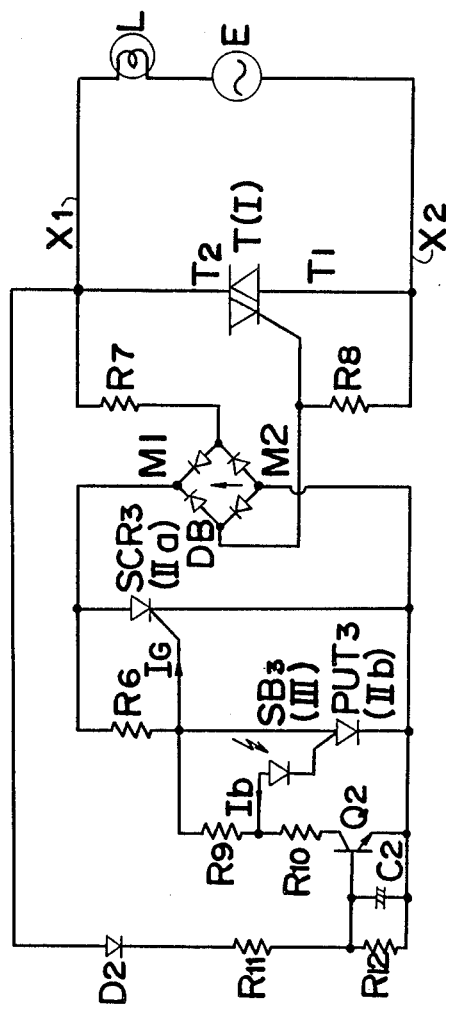
FIG. 11 is a circuit diagram of a light sensitive switching circuit of the second embodiment full-cycle type which is an improvement of the circuit of FIG. 10.

Referring to FIG. 11, a circuit diagram of a light sensitive switching circuit of the second embodiment full-cycle type is shown. The circuit of FIG. 11 is a modification of the circuit of FIG. 10.

A series connection of AC power source E and lantern L is connected between lines X1 and X2. Also a triac T is connected between lines X1 and X2. A suitable resistor R8 is connected between the gate of triac T and line X2. A diode bridge DB is connected between the gate of triac T and resistor R7, which is further connected to line X1. Diode bridge DB has terminals M1 and M2 between which a thyristors SCR3 is connected in the forward direction.

Between the gate and the cathode of thyristor SCR3, a programmable unijunction transistor PUT3 is connected such that the gate of thyristor SCR3 is connected to the anode of unijunction transistor PUT3 and the cathode of thyristor SCR3 is connected to the cathode of unijunction transistor PUT3. Also, a resistor R6 is connected between the gate and the anode of thyristor SCR3.

Between the gate and the anode of programmable unijunction transistor PUT3, resistor R9 and photocell SB3, e.g., a solar battery, are connected in series such that the cathode of photocell SB3 is connected to the gate of transistor PUT3. The cathode of transistor PUT3 is connected to terminal M2 of diode bridge DB.

A series connection of resistor R10 and transistor Q2 is connected between the junction between resistor R9 and photocell SB3 and the cathode of programmable unijunction transistor PUT3. A series connection of diode D2, resistors R11 and R12 is connected between terminal T2 of triac T and terminal M2 of diode bridge DB. A capacitor C1 is connected across resistor R12 and is also connected to the base of transistor Q2.

It is to be noted that, when the circuit of FIG. 11 is compared with the circuit of FIG. 9, triac T corresponds to first thyristor I, thyristors SCR3 corresponds to second thyristor IIa, programmable unijunction transistor PUT3 corresponds to third thyristor IIb, and photocells SB3 corresponds to photocell III.

The light sensitive switching circuit of the second embodiment full-cycle type shown in FIG. 10 operates in the following manner.

It is to be noted that programmable unijunction transistor PUT3 turns on when a predetermined voltage Vt is produced between its gate and anode.

When transistor Q2 is off, no current flows through resistors R9 and R10. Thus, no voltage is produced across resistor R9. In this case, it is required to generate the predetermined voltage Vt solely by photocell SB3 to turn transistor PUT3 on. To this end, photocell SB3 must receive a light with the illuminance of L2 or a brighter light.

When transistor Q2 is on, a current flows through resistors R9 and R10, thereby producing a certain voltage across resistor R9. In this case, the predetermined voltage Vt is established by the sum of the voltage across the resistor R9 and the voltage across the photocell SB3. To this end, photocell SB3 must receive a light with the illuminance of L1 or a brighter light.

It is assumed that photocell SB3 is now located in a dark place, such as in the night time. Under this condition, no voltage is produced across photocell SB3. Therefore, programmable unijunction transistor PUT3 is maintained off. Thus, thyristor SCR3 is turned on to make an electric connection between the gate of triac T and resistor R7, thereby turning triac T on. Thus, a current flows through triac T in both directions thereby supplying electric power to lantern L during both positive and negative half cycles of AC power. At this time, since triac T is on, no voltage is produced across resistor R12. Thus, transistor Q2 is maintained off.

Then, when photocell SB3 is located in a little bright place having the illuminance of L1 lux, photocell SB3 is so activated as to generate a voltage which is below the voltage Vt. Also, since no voltage is produced across resistor R9, programmable unijunction transistor PUT3 is maintained off. Thus, thyristor SCR3 continues to be turned on and, in turn, triac T is still maintained on, thereby lighting the lantern.

Then, when it becomes as bright as the illuminance of L2 lux, photocells SB3 itself generates the predetermined voltage Vt. Thus, programmable unijunction transistor PUT3 turn on, thereby turning thyristor SCR off. Thus, the electric connection between the gate of triac T and resistor R7 opens thereby turning triac T off. Thus, power is cut, turning lantern L off. When triac T is off, a small current flows from power source E, lantern L, line X1, diode D2, resistors R11 and R12, diode bridge DB, resistor R8 and line X2 and back to power source E. Accordingly, a predetermined voltage is produced across resistor R4 for charging capacitor C1. Then, by the voltage across capacitor C1, transistor Q2 turns on.

Then, when it becomes as dark as the illuminance between L1 lux and L2 lux, photocell SB3 is so activated as to generate a voltage which is less than the predetermined voltage Vt. However, because the sum of voltage across resistor R9 and photocell SB3 is greater than the predetermined voltage Vt, programmable unijunction transistor PUT3 is maintained on. Thus, thyristor SCR3 is still off and, in turn, triac T is maintained off. Thus, the lantern is not lit.

Then, when it becomes darker than the illuminance of L1 lux, the voltage generated across photocell SB3 becomes so small that the sum of voltage across resistor R9 and photocell SB3 is less than the predetermined voltage Vt. Accordingly, programmable unijunction transistor PUT3 is turned off. Thus, thyristor SCR3 turn on to establish a connection between the gate of triac T and resistor R7, thereby turning triac T on to effect the power supply to the lantern.

Third Embodiment

Figure 12:
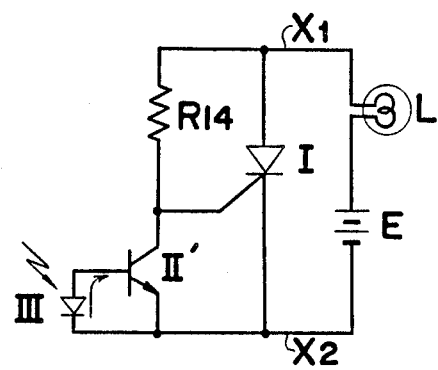
FIG. 12 is a circuit diagram of a light sensitive switching circuit according to a third embodiment of the present invention which is operative with a DC power source.

Referring to FIG. 12, a light sensitive switching circuit according to a third embodiment of the present invention is shown. Unlike the first and second embodiments, a DC power source, such as a battery E is employed. A series connection of DC power source and a load, such as a lantern L, is connected between lines X1 and X2. Also a thyristor I is connected between lines X1 and X2 such that its anode is connected to line X1 and its cathode is connected to line X2. A transistor II' is connected between the gate and the cathode of thyristor I such that the collector and the emitter of transistor II' are connected to the gate and the cathode of thyristor II', respectively. A photocell III, such as a solar battery, is connected between the base and the emitter of transistor II' such that its anode is connected to the base of transistor II' and its cathode is connected to the emitter of transistor II'. A suitable resistor R14 is connected between line X1 and the gate of thyristor I.

The light sensitive switching circuit of FIG. 12 operates in the following manner.

When it is bright, the light impinges on photocell III. Thus, a voltage is generated across photocell III to effect a current flow in the direction indicated by an arrow to the base of transistor II'. Accordingly, transistor II' turns on to shortcircuit the gate and cathode of thyristor I. Thus, thyristor I is turned off to cut the power supply to lantern L.

When it is dark, no or less light impinges on photocell III. Thus, no or little current flows to the base of transistor II'. Accordingly, transistor II' turns off to open between the gate and the cathode of thyristor I. Thus, a voltage is provided to the gate of thyristor I through resistor R14. Thus, thyristor I turns on to permit current flow from power source E through lantern L and thyristor I, thereby turning the lantern on.

According to the present invention, thyristor I, which directly controls the on and off state of the lantern, turns off when it is bright and turns on when it is dark. Also, the turning on and off of thyristor I is controlled by transistor II' and photocell III.

Figure 13:
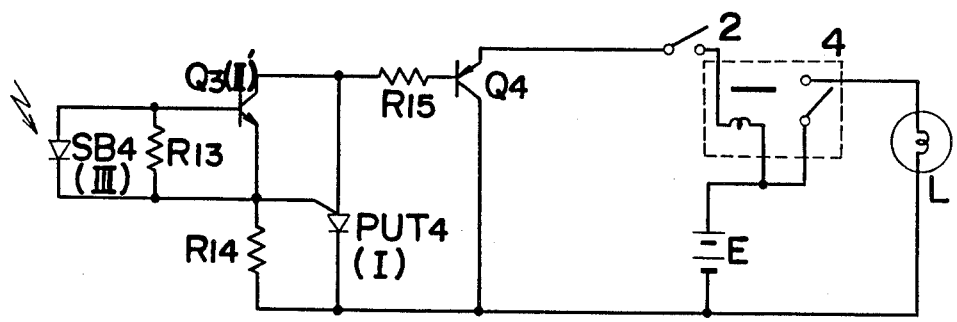
FIG. 13 is a circuit diagram of a light sensitive switching circuit of the third embodiment showing a modification of the circuit of FIG. 13.

Referring to FIG. 13, a circuit diagram of a light sensitive switching circuit of the third embodiment is shown.

A DC power source E, a lantern L and a solenoid switch 4 are connected in series. Also, DC power source E, the coil of the solenoid switch, a manual switch 2 are connected in series between lines X1 and X2. A transistor Q4 is connected between lines X1 and X2. The base of transistor Q4 is connected through a suitable resistor R15 and a programmable unijunction transistor PUT4 to line X2. A transistor Q3 is connected between the anode and the gate of programmable unijunction transistor PUT4 and a resistor R14 is connected between the gate and the cathode of the programmable unijunction transistor PUT4. A photocell SB4 and a resistor R13 are connected parallel between the base and emitter of transistor Q3.

It is to be noted that, when the circuit of FIG. 13 is compared with the circuit of FIG. 12, programmable unijunction transistor PUT4 corresponds to thyristory I, transistor Q3 corresponds to transistor II', and photocell SB4 corresponds to photocell III.

The light sensitive switching circuit of the third embodiment shown in FIG. 13 operates in the following manner.

It is assumed that photocell SB4 is now located in a dark place, such as in the night time. Under this condition, no voltage is produced across resistor R13, thereby turning transistor Q3 off. Thus, a small current is permitted to flow from the anode to the gate of programmable unijunction transistor PUT4 and further to resistor R14. Therefore, programmable unijunction transistor PUT4 turns on. Thus, transistor Q4 also turns on. Under this condition, upon turn on of switch 2 manually, the solenoid will be excited, thereby enabling the turn on of switch 4 to supply power to lantern L.

Then, when photocell SB4 is located in a bright place, a voltage is generated across resistor R13, thereby turning transistor Q3 on. Thus, the gate and anode of programmable unijunction transistor PUT4 are shortcircuited to turn transistor PUT4 off. Thus, transistor Q4 is also turned off. Under this condition, even if switch 2 is turned on, the solenoid will not be excited, thereby disablinhg.the turn on of switch 4.

The switching circuit of FIG. 13 is employed, for example, in an automobile for preventing the turn on of head light during the day time even when the switch is turned on.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. A light sensitive switching circuit for supplying electric power from a power source to a load when it becomes darker than a predetermined brightness comprising:
    first and second lines means for connecting said power source and said load in series therebetween to supply power from said power source;
    a first thyristor connected between said first and second lines means;
    a second thyristor connected to said first thyristor such that the anode of said second thyristor is connected to the gate of said first thyristor and the cathode of said second thyristor is connected to the cathode of said first thyristor;
    a photovoltaic cell connected between the gate and the cathode of said second thyristor.

2. A light sensitive switching circuit as claimed in claim 1, further comprising a resistor connected between the gate and the anode of said first thyristor.

3. A light sensitive switching circuit as claimed in claim 1, wherein said power source is an AC power source.

4. A light sensitive switching circuit for supplying electric power from an AC power source to a load when it becomes darker than a first predetermined brightness and cutting the power when it becomes brighter than a second predetermined brightness, which is brighter than said first predetermined brightness, comprising:
    first and second lines means for connecting said power source and said load in series therebetween;
    a first thyristor connected between said first and second lines means;
    a second thyristor connected to said first thyristor such that the anode of said second thyristor is connected to the gate of said first thyristor and the cathode of said second thyristor is connected to the cathode of said first thyristor;
    a first photocell means connected between the gate and the anode of said second thyristor;
    a third thyristor connected to said first thyristor such that the anode of said third thyristor is connected to the gate of said first thyristor;
    a second photocell means connected between the gate and the anode of said third thyristor, said second photocell means being sensitive to a brighter light than that sensitive to said first photocell means;
    a bypass circuit connected across said first thyristor for producing a predetermined voltage when said first thyristor is off; and
    a transistor connected between the cathode of said first thyristor and the cathode said third thyristor and controlled by said bypass circuit such that said transistor turns on when said predetermined voltage is produced by said bypass circuit.

5. A light sensitive switching circuit as claimed in claim 4, wherein said second and third thyristors both comprise a programmable unijunction transistor.

6. A light sensitive switching circuit as claimed in claim 4, wherein said bypass circuit comprises a series connection of a diode and resistor means, and a capacitor connected parallel to said resistor means.

7. A light sensitive switching circuit as claimed in claim 4 wherein said first thyristor is a triac.

8. A light sensitive switching circuit as claimed in claim 7, further comprising a diode bridge having one pair of terminals connected between the gate and one terminal of said triac and another pair of terminals between said anode and cathode of said second thyristor.

9. A light sensitive switching circuit for supplying electric power from an AC power source to a load when it becomes darker than a first predetermined brightness and cutting the power when it becomes brighter than a second predetermined brightness, which is brighter than said first predetermined brightness, comprising:
    first and second lines means for connecting said power source and said load in series therebetween;
    a first thyristor connected between said first and second lines means;
    a second thyristor connected to said first thyristor such that the anode of said second thyristor is connected to the anode of said first thyristor and the cathode of said second thyristor is connected to the gate of said first thyristor;

a third thyristor connected to said second thyristor such that the anode of said third thyristor is connected to the gate of said second thyristor and the cathode of said third thyristor is connected to the cathode of said second thyristor; and a photocell means connected between the gate and the cathode of said third thyristor.

10. A light sensitive switching circuit for supplying electric power from an AC power source to a load when it becomes darker than a first predetermined brightness and cutting the power when it becomes brighter than a second predetermined brightness, which is brighter than said first predetermined brightness, comprising:

first and second lines means for connecting said power source and said load in series therebetween;

a first thyristor connected between said first and second lines means;

a second thyristor connected to said first thyristor such that the anode of said second thyristor is connected to the anode of said first thyristor and the cathode of said second thyristor is connected to the gate of said first thyristor;

a third thyristor connected to said second thyristor such that the anode of said third thyristor is connected to the gate of said second thyristor and the cathode of said third thyristor is connected to the cathode of said second thyristor;

a first photocell means connected between the gate and the anode of said third thyristor;

a fourth thyristor connected to said first thyristor such that the anode of said fourth thyristor is connected to the anode of said first thyristor and the cathode of said fourth thyristor is connected to the gate of said first thyristor;

a fifth thyristor connected to said fourth thyristor such that the anode of said fifth thyristor is connected to the gate of said fourth thyristor and the cathode of said fifth thyristor is connected to the cathode of said fourth thyristor;

a second photocell means connected between the gate and the anode of said fifth thyristor, said second photocell means being sensitive to a brighter light than that sensitive to said first photocell means;

a bypass circuit connected across said first thyristor for producing a predetermined voltage when said first thyristor is off; and a transistor connected between the cathode and the anode of said third thyristor and controlled by said bypass circuit such that said transistor turns on when said predetermined voltage is produced by said bypass circuit.

11. A light sensitive switching circuit as claimed in claim 10, wherein said third and fifth thyristors are each defined by a programmable unijunction transistor.

12. A light sensitive switching circuit as claimed in claim 10, wherein said bypass circuit comprises a series connection of a diode and resistor means, and a capacitor connected parallel to said resistor means.

13. A light sensitive switching circuit as claimed in claim 10, wherein said first thyristor is a triac.

14. A light sensitive switching circuit as claimed in claim 13, further comprising a diode bridge having one pair of terminals connected between the gate and one terminal of said triac and another pair of terminals between said anode and cathode of said second thyristor.

15. A light sensitive switching circuit for supplying electric power from an AC power source to a load when it becomes darker than a first predetermined brightness and cutting the power when it becomes brighter than a second predetermined brightness, which is brighter than said first predetermined brightness, comprising:

first and second lines means for connecting said power source and said load in series therebetween;

a triac connected between said first and second lines means;

a diode bridge having one pair of terminals connected between the gate and one terminal of said triac;

a first thyristor having the anode and cathode thereof connected between another pair of terminals of said diode bridge;

a second thyristor connected to said first thyristor such that the anode of said second thyristor is connected to the gate of said first thyristor and the cathode of said second thyristor is connected to the cathode of said first thyristor;

a series connection of photocell and a resistor connected between the gate and the anode of said second thyristor;

a bypass circuit connected across said triac for producing a predetermined voltage when said first thyristor is off; and a transistor connected to said resistor for producing a predetermined voltage across said resistor when said predetermined voltage is produced by said bypass circuit.

16. A light sensitive switching circuit for supplying electric power from a DC power source to a load when it becomes darker than a predetermined brightness comprising:

first and second lines means for connecting said power source and said load in series therebetween to supply power from said DC power source;

a first thyristor connected between said first and second lines means;

a transistor connected between the gate and cathode of said first thyristor; and a photovoltaic cel connected between the base and the emitter of said transistor.

* * * * *